United States Patent
Kim et al.

(10) Patent No.: US 9,190,657 B2
(45) Date of Patent: Nov. 17, 2015

(54) METHOD FOR SYNTHESIZING NANO SCALE ELECTRODE MATERIALS USING AN ULTRA-FAST COMBUSTION METHOD, AND NANO SCALE ELECTRODE MATERIALS SYNTHESIZED BY THE METHOD

(75) Inventors: Jae Kook Kim, Gwangju (KR); Eun Joung Kim, Gwangju (KR); In Sun Yoo, Gwangju (KR); Jin Sub Lim, Gwangju (KR)

(73) Assignee: INDUSTRY FOUNDATION OF CHONNAM NATIONAL UNIVERSITY, Gwangju (KR)

( * ) Notice: Subject to any disclaimer, the term of this patent is extended or adjusted under 35 U.S.C. 154(b) by 369 days.

(21) Appl. No.: 13/641,441

(22) PCT Filed: Apr. 14, 2011

(86) PCT No.: PCT/KR2011/002674
§ 371 (c)(1),
(2), (4) Date: Mar. 29, 2013

(87) PCT Pub. No.: WO2011/129636
PCT Pub. Date: Oct. 20, 2011

(65) Prior Publication Data
US 2013/0177810 A1 Jul. 11, 2013

(30) Foreign Application Priority Data
Apr. 15, 2010 (KR) .................. 10-2010-0034889

(51) Int. Cl.
*B82B 3/00* (2006.01)
*H01M 4/131* (2010.01)
*H01M 4/58* (2010.01)
*C01B 25/45* (2006.01)
*H01M 4/36* (2006.01)
*H01M 4/587* (2010.01)
*H01M 4/62* (2006.01)
*H01L 21/28* (2006.01)
*H01M 10/052* (2010.01)

(52) U.S. Cl.
CPC .............. *H01M 4/131* (2013.01); *C01B 25/45* (2013.01); *H01M 4/366* (2013.01); *H01M 4/587* (2013.01); *H01M 4/5825* (2013.01); *H01M 4/625* (2013.01); *B82B 3/00* (2013.01); *H01L 21/28* (2013.01); *H01M 10/052* (2013.01)

(58) Field of Classification Search
None
See application file for complete search history.

(56) References Cited

U.S. PATENT DOCUMENTS

| | | | |
|---|---|---|---|
| 2004/0033360 A1* | 2/2004 | Armand et al. | 428/408 |
| 2008/0206484 A1* | 8/2008 | Kostecki et al. | 427/575 |
| 2009/0148765 A1 | 6/2009 | Cao et al. | |
| 2010/0279117 A1* | 11/2010 | Gu | 428/402 |
| 2011/0068294 A1* | 3/2011 | Zaghib et al. | 252/182.1 |
| 2012/0064409 A1* | 3/2012 | Zhamu et al. | 429/221 |

FOREIGN PATENT DOCUMENTS

| | | |
|---|---|---|
| KR | 2003-0045791 | 6/2003 |
| KR | 10-2007-0048675 | 5/2007 |
| KR | 10-2007-0053667 | 5/2007 |
| KR | 20090108955 A * | 10/2009 |

* cited by examiner

*Primary Examiner* — Steven Bos
(74) *Attorney, Agent, or Firm* — Kile Park Reed & Houtteman PLLC

(57) ABSTRACT

Provided are embodiments of a method of synthesizing nano scale electrode materials using an ultrafast combustion technique and nano scale electrode materials synthesized using the method. The method does not require a process of annealing reaction products required for synthesis of electrode materials or any other additional processes, such as cleaning, filtering, and drying processes, so that it can take only several seconds to several minutes to obtain a resultant product.

15 Claims, 5 Drawing Sheets

METHOD FOR SYNTHESIZING NANO SCALE ELECTRODE MATERIALS USING AN ULTRA-FAST COMBUSTION METHOD, AND NANO SCALE ELECTRODE MATERIALS SYNTHESIZED BY THE METHOD

CROSS-REFERENCE TO RELATED APPLICATION

This application claims priority to Korean Patent Application No. 10-2010-0034889 filed on Apr. 15, 2010, and all the benefits accruing therefrom under 35 U.S.C. §119, the contents of which are incorporated by reference in their entirety.

BACKGROUND

Recently, rapid developments of the electronics industry, various information communications including mobile communications, and mobile information technology (IT) products has led to an increase in the use of secondary batteries. Owing to techniques for producing hybrid automobiles, the demand for batteries having larger capacities and higher energy densities has started to increase. As a result, lithium (Li) secondary batteries having the highest performance, among batteries having large capacities and high energy densities, have been required more and more. To meet these requirements, it has become more necessary to improve performance of active materials among electrode materials.

Three essential components of lithium secondary batteries are a positive electrode, a negative electrode, and an electrolyte. Lithium transition metal compounds, such as $LiCoO_2$, $LiMn_2O_4$, $LiNiO_2$, $Li(Mn,Ni,Co)O_2$, $LiMnO_2$, or $LiFePO_4$, may be mainly used as positive electrode active materials of the lithium secondary batteries. Lithium ions of these materials are intercalated into and deintercalated from crystalline structures to cause electrochemical reactions.

As application fields of lithium secondary batteries start from small-sized electronic products and cover a wide range, the efficiency of industrial activity of portable and mobile electronic products and hybrid automobiles has greatly improved. However, due to some disadvantages of batteries, such as thermal instability, high prices, and long manufacturing times, a large amount of research has been conducted into developing cheap, safe materials, reducing manufacturing process times, and improving economical efficiency.

The commonest material of positive electrode materials capable of causing improvements in price, safety, and capacity and producing the maximum effects, among battery materials, is $LiCoO_2$. Although $LiCoO_2$ has good conductivity and high performance, since $LiCoO_2$ is expensive and problematic in safety, materials to replace cobalt (Co)-containing positive electrode materials are being studied. Among powerful candidates, $LiFePO_4$, which has a theoretical capacity of about 170 mAh/g, provides theoretical capacities according to conditions and is superior to $LiCoO_2$ in terms of price and safety.

However, the biggest disadvantage of $LiFePO_4$ is low conductivity. $LiFePO_4$ itself has low electrical conductivity, and large particles of $LiFePO_4$ have low ionic conductivity. To solve this problem, research has been conducted on various methods, for example: a method of improving a diffusion speed of lithium ions by synthesizing uniformly distributed small-sized particles to enhance rate capability, or a method of coating $LiFePO_4$ with carbon (C) to improve electrical conductivity.

However, to synthesize $LiFePO_4$ having high crystallinity using a conventional method, such as a solid-state reaction, a sol-gel reaction, thermal synthesis, or a co-precipitation reaction, an annealing process should be performed at a high temperature. Also, a polyol method involves a cleaning process, a filtering process, and a drying process. Accordingly, a synthesis process may be complicated, incur high costs, and degrade time efficiency.

SUMMARY

The present disclosure is directed to a method of synthesizing nano scale electrode materials and nano scale electrode materials synthesized using the method, by which nano scale electrode materials having good crystallinity and uniform particles may be obtained by merely performing a synthesis process at room temperature without a post-processing process and other additional processes, which were necessary to elevate crystallinity in a conventional synthesis method. Also, the present disclosure is directed to a method of synthesizing nano scale electrode materials having nanocrystalline structures and nano scale electrode materials synthesized using the method, by which the nano scale electrode materials are uniformly coated with carbon (C) simultaneously with synthesis of nano scale electrode materials. Furthermore, the present disclosure is directed to a method of synthesizing nano scale electrode materials, and nano scale electrode materials synthesized using the method, which can have highly competitive prices, in which production efficiency can be greatly increased to reduce price and enable scaling-up, and which can aim at ensuring high stability and improving ionic conductivity in expectation of high discharge capacity when the nano scale electrode materials are applied to positive electrode active materials serving as electrode materials. In addition, the present disclosure is directed to a method of synthesizing nano scale electrode materials, nano scale electrode materials synthesized using the method, and secondary batteries, which have electrochemically stable characteristics (e.g., discharge capacity is not greatly reduced in spite of a high initial discharge capacity and large numbers of charging and discharging operations) and enable production of large-capacity batteries for hybrid automobiles in which safety is essential, and batteries related to renewable energy.

The technical objectives of the present disclosure are not limited to the above disclosure; other objectives may become apparent to those of ordinary skill in the art based on the following descriptions.

One aspect of the present disclosure provides a method of synthesizing nano scale electrode materials. The method includes preparing a reaction solution by mixing a polyol solvent, a transition metal compound, a polyacid anionic compound, a lithium (Li)-based compound, and a combustible liquid, burning the reaction solution, and obtaining nano scale electrode materials by retrieving particles remaining after the burning of the reaction solution.

The transition metal compound, the polyacid anionic compound, and Li-based compound are contained in the prepared reaction solution at a molar ratio of 1:1:1.

The polyol solvent is at least one selected from the group consisting of ethylene glycol (EG), diethylene glycol (DEG), tetraethylene glycol (TTEG), propylene glycol (PG), and butylene glycol (BG).

The transition metal compound is at least one selected from the group consisting of an iron (Fe)-based compound, a manganese (Mn)-based compound, a nickel (Ni)-based compound, a cobalt (Co)-based compound, a titanium (Ti)-based compound, and a vanadium (V)-based compound.

The Fe-based compound is at least one selected from the group consisting of $Fe(CH_3COO)_2$, $Fe(NO_3)_2$, $FeC_2O_2$, FeSO$_4$, FeCl$_2$, FeI$_2$, and FeF$_2$. The Mn-based compound is at least one selected from the group consisting of Mn(CH$_3$COO)$_2$, Mn(NO$_3$)$_2$, MnSO$_4$, MnC$_2$O$_2$, MnCl$_2$, MnI$_2$, and MnF$_2$.

The Ni-based compound is at least one selected from the group consisting of Ni(CH$_3$COO)$_2$, Ni(NO$_3$)$_2$, NiSO$_4$, NiC$_2$O$_2$, NiCl$_2$, NiI$_2$, and NiF$_2$.

The Co-based compound is at least one selected from the group consisting of Co(CH$_3$COO)$_2$, Co(NO$_3$)$_2$, CoSO$_4$, CoC$_2$O$_2$, CoCl$_2$, CoI$_2$, and CoF$_2$.

The Ti-based compound is at least one selected from the group consisting of TiH$_2$ or titanium isopropoxide (TTIP).

The V-based compound is at least one selected from the group consisting of V(CH$_3$COO)$_2$, V(NO$_3$)$_2$, VSO$_4$, VC$_2$O$_2$, VCl$_2$, VI$_2$, and VF$_2$.

The polyacid anionic compound is a phosphoric acid ionic compound or a sulfuric acid ionic compound.

The phosphoric acid ionic compound is at least one selected from the group consisting of NH$_4$H$_2$PO$_4$, H$_3$PO$_4$, (NH$_4$)$_2$HPO$_4$, and (NH$_4$)$_3$PO$_4$.

The sulfuric acid ionic compound is at least one selected from the group consisting of H$_2$SO$_4$, (NH$_4$)$_2$SO$_4$, FeSO$_4$, MnSO$_4$, NiSO$_4$, CoSO$_4$, VSO$_4$, and TiSO$_4$.

The Li-based compound is at least one selected from the group consisting of CH$_3$COOLi, LiOH, LiNO$_3$, LiCO$_3$, Li$_3$PO$_4$, and LiF.

The combustible liquid is at least one selected from the group consisting of ethanol, methanol, acetone, painting oil, acete aldehyde, thinner, kerosene, and gasoline.

Another aspect of the present disclosure provides a nano scale electrode material obtained using any one of the above-described synthesis methods.

The nano scale electrode material is one selected from the group consisting of LiFePO$_4$, LiCoPO$_4$, LiNiPO$_4$, LiTiPO$_4$, Li$_x$V$_y$(PO$_4$)$_z$, Li$_x$Ti$_y$(PO$_4$)$_z$, Li$_x$V$_y$(PO$_4$)$_y$, LiVPO$_4$F, Li$_x$Fe$_y$(SO$_4$)$_z$, Li$_x$Mn$_y$(SO$_4$)$_z$, Li$_x$Co$_y$(SO$_4$)$_z$, Li$_x$Ni$_y$(SO$_4$)$_z$, Li$_x$Ti$_y$(SO$_4$)$_z$, and Li$_x$V$_y$(SO$_4$)$_z$. Herein, each of x, y, and z is an integer.

The nano scale electrode material has a nanocrystalline structure coated with carbon (C).

The nanocrystalline structure includes a carbon coating layer with a thickness of about 2 nm to about 3 nm.

Another aspect of the present disclosure provides a secondary battery including the above-described nano scale electrode material.

The present disclosure has the following excellent effects.

Initially, according to the present disclosure, by merely performing a synthesis process at room temperature without a post-processing process and other additional processes that were conventionally necessary to increase crystallinity, nano scale electrode materials having high crystallinity and uniform particles can be synthesized.

Unlike a conventional synthesis method involving an artificial carbon coating process through an intricate process of adding a new tertiary material to improve conductivity of an electrode material, according to the present disclosure, electrode materials having nanocrystalline structures can be uniformly coated with carbon simultaneously with synthesis of the electrode materials.

In addition, since the present disclosure has highly competitive prices and greatly increases production efficiency, price reduction and scaling-up can be enabled. Also, when applied to positive electrode active materials serving as electrode materials, the present disclosure can aim at ensuring high stability and improving ionic conductivity in expectation of high discharge capacity.

Furthermore, the present disclosure provides electrochemically stable characteristics (e.g., discharge capacity is not greatly reduced in spite of a high initial discharge capacity and large numbers of charging and discharging operations) and enables production of large-capacity batteries for hybrid automobiles in which safety is essential, and batteries related to renewable energy.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
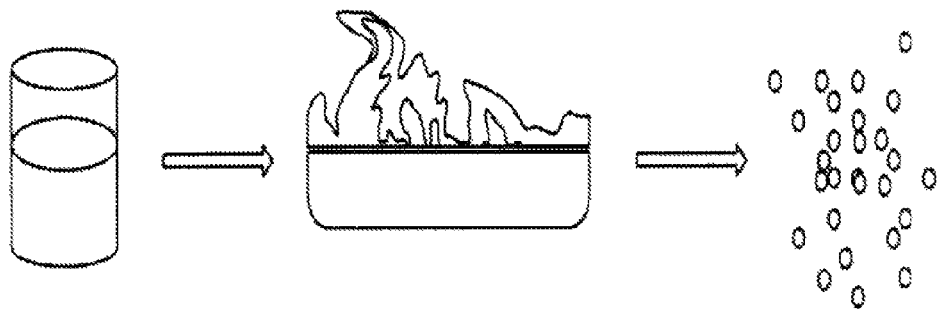
FIG. 1 is a schematic diagram illustrating a method of synthesizing a nano scale electrode material according to the present disclosure.

Exemplary embodiments will be described in detail with reference to the accompanying drawings. Since the present disclosure may have modified embodiments, preferred embodiments are illustrated in the drawings and are described in the detailed description of the invention. However, this does not limit the present disclosure within specific embodiments and it should be understood that the present disclosure covers all the modifications, equivalents, and replacements within the idea and technical scope of the present disclosure. In the drawings, the dimensions and size of each structure may be exaggerated, omitted, or schematically illustrated for convenience in description and clarity.

It will be understood that although the terms of first and second are used herein to describe various elements, these elements should not be limited by these terms. Terms are only used to distinguish one component from other components. Therefore, a component referred to as a first component in one embodiment can be referred to as a second component in another embodiment.

In the following description, the technical terms are used only for explaining a specific exemplary embodiment while not limiting the present disclosure. The terms of a singular form may include plural forms unless referred to the contrary. The meaning of 'include', 'have', or 'comprise' specifies a property, a step, a function, an element, or a combination thereof, but does not exclude other properties, steps, functions, elements, or combinations thereof.

Unless terms used in the present description are defined differently, the terms should be construed as having the one or more meanings known to those skilled in the art. Terms that are generally used and have been defined in dictionaries should be construed as having meanings matched with contextual meanings in the art. In this description, unless defined clearly, terms are not ideally or excessively construed as formal meanings.

The present disclosure is characterized by performing only a synthesis process using an ultrafast combustion method at room temperature with no post-processing process or other additional processes that were conventionally necessary to increase crystallinity, so that nano scale electrode materials having high crystallinity and uniform particles coated with carbon can be synthesized.

Accordingly, a method of synthesizing nano scale electrode materials according to the present disclosure includes preparing a reaction solution by mixing a polyol solvent, a transition metal compound, a polyacid anionic compound, a lithium (Li)-based compound, and a combustible liquid, and burning the reaction solution. Here, the burning of the reaction solution includes pouring the reaction solution on a flat substrate heated to a temperature of about 25° C. to about 300° C. to spread the reaction solution and lighting the reaction solution on fire to completely burn the reaction solution.

More specifically, initially, the preparation of the reaction solution may include preparing the polyol solvent and manufacturing the reaction solution by mixing the polyol solvent with the transition metal compound, the polyacid anionic compound, a Li-based compound solution, and the combustible liquid.

In the present disclosure, the polyol solvent not only acts as both a solvent and a stabilizer but also serves to prevent growth of particles. Since the polyol solvent produces a reducing atmosphere at a boiling point, the polyol solvent plays an important role in maintaining the oxidation number of a transition metal.

Therefore, the polyol solvent used in the present disclosure is not specifically limited as long as the polyol solvent is a material (polyol) containing at least two hydroxyl (—OH) groups per molecule. However, the polyol solvent used in the present disclosure is preferably at least one selected from the group consisting of ethylene glycol (EG), diethylene glycol (DEG), tetraethylene glycol (TTEG), propylene glycol (PG), and butylene glycol (BG).

In addition, the transition metal compound used in the present disclosure is not specifically limited but preferably any transition metal compound selected from the group consisting of an iron (Fe)-based compound, a manganese (Mn)-based compound, a nickel (Ni)-based compound, a cobalt (Co)-based compound, a titanium (Ti)-based compound, and a vanadium (V)-based compound. More preferably, the Fe-based compound is at least one selected from the group consisting of $Fe(CH_3COO)_2$, $Fe(NO_3)_2$, $FeC_2O_2$, $FeSO_4$, $FeCl_2$, $FeI_2$, and $FeF_2$. The Mn-based compound is at least one selected from the group consisting of $Mn(CH_3COO)_2$, $Mn(NO_3)_2$, $MnSO_4$, $MnC_2O_2$, $MnCl_2$, $MnI_2$, and $MnF_2$. The Ni-based compound is at least one selected from the group consisting of $Ni(CH_3COO)_2$, $Ni(NO_3)_2$, $NiSO_4$, $NiC_2O_2$, $NiCl_2$, $NiI_2$, and $NiF_2$. The Co-based compound is at least one selected from the group consisting of $Co(CH_3COO)_2$, $Co(NO_3)_2$, $CoSO_4$, $CoC_2O_2$, $CoCl_2$, $CoI_2$, and $CoF_2$. The Ti-based compound is at least one selected from the group consisting of $TiH_2$ or titanium isopropoxide (TTIP). The V-based compound is at least one selected from the group consisting of $V(CH_3COO)_2$, $V(NO_3)_2$, $VSO_4$, $VC_2O_2$, $VCl_2$, $VI_2$, and $VF_2$.

Furthermore, the polyacid anionic compound may be used with no particular limitation when the polyacid anionic compound is any compound containing polyacid anions. The polyacid anionic compound may be a phosphoric acid ionic compound or a sulfuric acid ionic compound. More preferably, at least one selected from the group consisting of $NH_4H_2PO_4$, $H_3PO_4$, $(NH_4)_2HPO_4$, and $(NH_4)_3PO_4$ may be used as the phosphoric acid ionic compound, and at least one selected from the group consisting of $H_2SO_4$, $(NH_4)_2SO_4$, $FeSO_4$, $MnSO_4$, $NiSO_4$, $CoSO_4$, $VSO_4$, and $TiSO_4$ may be used as the sulfuric acid ionic compound.

In addition, the Li-based compound is not specifically limited and may be any Li-containing compound. Preferably, the Li-based compound may include at least one material selected from the group consisting of $CH_3COOLi$, LiOH, $LiNO_3$, $LiCO_3$, $Li_3PO_4$, and LiF.

Furthermore, the combustible liquid contained in the reaction solution generates much heat during the burning of the reaction solution and becomes energy required to form particles. Also, the combustible liquid plays an important role in elevating crystallinity. The combustible liquid used in the present disclosure is not specifically limited, but is preferably at least one selected from the group consisting of ethanol, methanol, acetone, painting oil, acete aldehyde, thinner, kerosene, and gasoline.

In this case, the transition metal compound, the polyacid anionic compound, and Li-based compound are preferably contained in a stoichiometrically prepared reaction solution at a molar ratio of 1:1:1. The combustible liquid is preferably contained at such a content as to enable complete combustion of the polyol solvent and other compounds included in the reaction solution. When the polyol solvent and the combustible liquid are contained at a weight ratio of less than 20:1, the content of the combustible liquid is too low to completely burn the reaction solution.

Next, the burning of the reaction solution includes burning the reaction solution obtained by mixing the polyol solvent, the transition metal compound, the polyacid anionic compound, the lithium-based compound, and the combustible liquid to obtain a particle resultant product coated with carbon (C). Accordingly, although any apparatus capable of a combustion reaction may be variously used with no particular limitation, as shown in FIG. 1, the burning of the reaction solution is preferably performed by pouring the reaction solution on a flat substrate heated to a temperature of about 25° C. to about 300° C. to spread the reaction solution and lighting the reaction solution on fire. More preferably, a heating plate apparatus (e.g., a hot plate) capable of controlling a temperature and maintaining a predetermined temperature may be used to lower thermal conduction and use heat and temperature as energy for generating particles without the loss of the heat and temperature. In this case, since it takes only several seconds to several minutes to perform combustion, only a very short time is required to manufacture nano scale electrode materials, thereby markedly increasing productivity.

As described above, a method of synthesizing nano scale electrode materials according to the present disclosure may be used to synthesize various carbon-coated electrode materials having nanocrystalline structures by merely burning a mixture of a polyol solvent with combustible liquids. For example, various resultant products may include $LiFePO_4$, $LiCoPO_4$, $LiNiPO_4$, $LiV(PO_4)$, $LiTi(PO_4)$, $LiVPO_4F$, LiFe (SO$_4$), LiMn(SO$_4$), LiCo(SO$_4$), LiNi(SO$_4$), LiTi(SO$_4$) and LiV(SO$_4$) and have nanocrystalline structures, such as Li$_x$V$_y$(PO$_4$)$_z$, Li$_x$Ti$_y$(PO$_4$)$_z$, Li$_x$V$_y$(PO$_4$)$_y$, LiVPO$_4$F, Li$_x$Fe$_y$(SO$_4$)$_z$, Li$_x$Mn$_y$(SO$_4$)$_z$, Li$_x$Co$_y$(SO$_4$)$_z$, Li$_x$Ni$_y$(SO$_4$)$_z$, Li$_x$Ti$_y$(SO$_4$)$_z$, and Li$_x$V$_y$(SO$_4$)$_z$. In this case, the nano scale electrode materials may be manufactured by adjusting a molar ratio of the reaction solution with no particular limitation when each of x, y, and z is an integer.

Therefore, in a method of synthesizing nano scale electrode materials according to the present disclosure, electrode materials having nanocrystalline structures may be synthesized without annealing resultant products as a post-processing process. Also, carbon-coated electrode materials may be synthesized without additional processes, such as cleaning, filtering, and drying processes, after a combustion process. After preparing a reaction solution containing a polyol solvent and a combustible liquid, a combustion time of only several seconds to several minutes is consumed to synthesize the electrode materials so that manufacturing costs can be greatly saved.

Meanwhile, nano scale electrode materials used in the present disclosure refer to electrode materials having nanoscale crystalline structures. In the present disclosure, a nanoscale range broadly refers to a range of about 1 mm or less, normally refers to a range of several hundred nm or less, preferably refers to a range of about 100 nm or less, and more preferably refers to a range of about 10 nm to about 50 nm.

Example 1

A reaction solution was prepared by adding Fe(CH$_3$COO)$_2$ serving as a transition metal compound, H$_3$PO$_4$ serving as a phosphoric acid ionic compound, CH$_3$COOLi serving as a lithium-based compound, and thinner serving as a combustible liquid to a tetra ethylene glycol (TTEG) solvent. In this case, Fe(CH$_3$COO)$_2$, H$_3$PO$_4$, and CH$_3$COOLi were mixed at a molar ratio of 1:1:1, and the thinner was mixed at a content of about ⅕ the total solution. That is, TTEG and the thinner were mixed at a weight ratio of 5:1.

Thereafter, about 25 ml of the reaction solution was poured on a flat heating plate heated to a temperature of about 100° C. to uniformly spread the reaction solution, and the reaction solution was lit on fire and completely burnt. Subsequently, after the resolution solution was completely burnt and the fire was naturally extinguished, particles were retrieved from the heating plate to obtain LiFePO$_4$, which was nano scale electrode material 1.

Example 2

The same method as in Example 1 was performed except that Mn(CH$_3$COO)$_2$ was used as a transition metal compound, thereby obtaining LiMnPO$_4$, which was nano scale electrode material 2.

Comparative Example

Fe(CH$_3$COO)$_2$ serving as a transition metal compound, H$_3$PO$_4$ serving as a phosphoric acid ionic compound, and CH$_3$COOLi serving as a lithium-based compound were used as in Example 1 and synthesized using a commercially available solid-state reaction method [i.e., mixing reagents having lithium (Li), iron (Fe), and phosphorus (P) sources, ball-milling the mixture for several tens of hours, and annealing the mixture at a high temperature of about 600° C. to about 700° C. to improve crystallinity] to obtain LiFePO$_4$, which was a comparative electrode material.

Experimental Example 1

Figure 2:
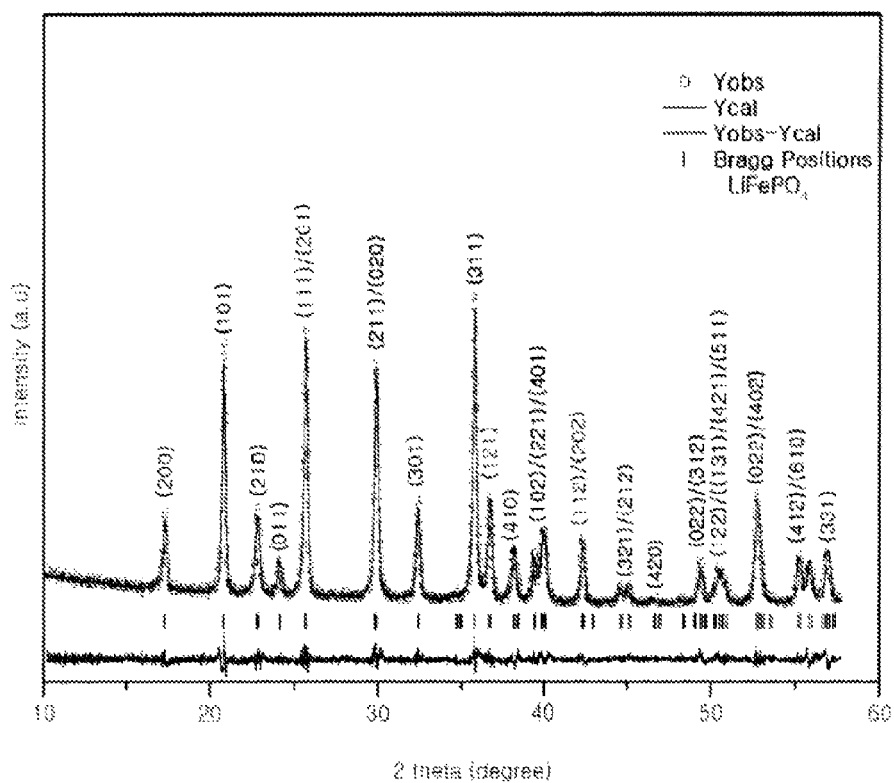
FIG. 2 is a graph showing an X-ray diffraction (XRD) pattern of LiFePO$_4$, which is a nano scale electrode material synthesized using a method of synthesizing a nano scale electrode material according to Example 1 of the present disclosure.

X-ray diffraction (XRD) patterns of LiFePO$_4$, which was the nano scale electrode material 1 obtained in Example 1 of the present disclosure, were analyzed and are shown in FIG. 2.

Referring to FIG. 2, it can be seen that all peaks of the XRD patterns of the nano scale electrode material 1 have rhombic olivine structures.

Therefore, it can be seen that, in a method of synthesizing nano scale electrode materials according to the present disclosure, LiFePO$_4$ having olivine structures may be synthesized without performing an additional annealing process.

Experimental Example 2

Figure 3:
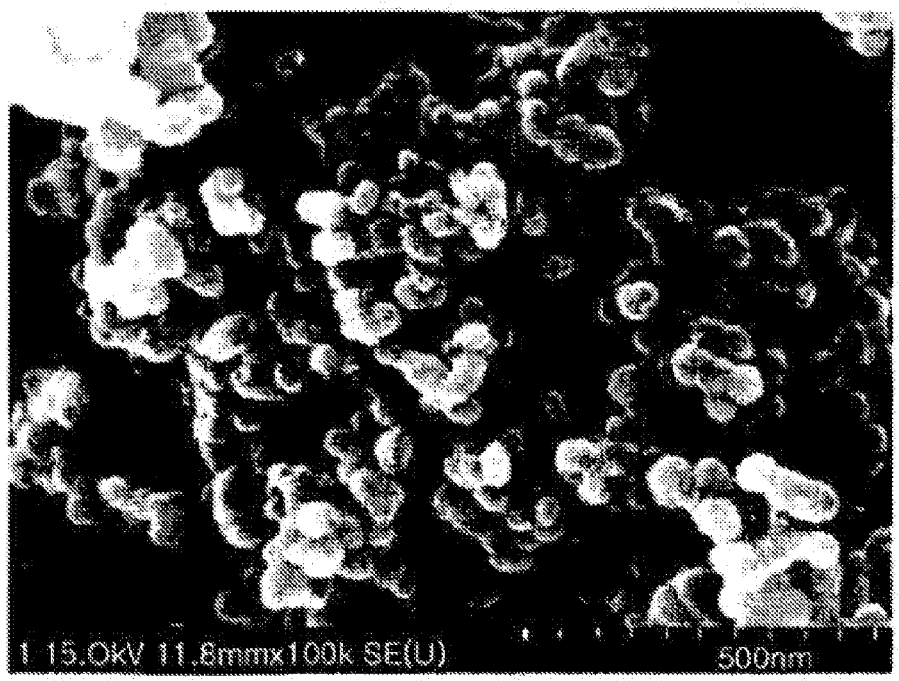
FIGS. 3 and 4 are scanning electron microscope (SEM) images of LiFePO$_4$ and LiMnPO$_4$, which are nano scale electrode materials 1 and 2 synthesized using methods of synthesizing nano scale electrode materials according to Examples 1 and 2 of the present disclosure.
Figure 4:
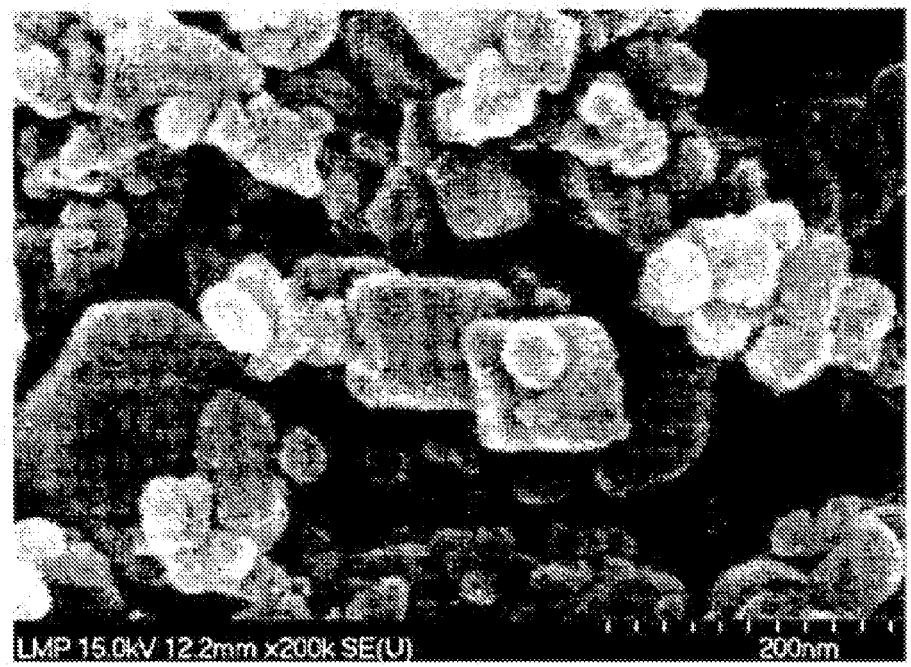

To confirm the crystalline structures and sizes of nano scale electrode materials 1 and 2 obtained in Examples 1 and 2 of the present disclosure, LiFePO$_4$ and LiMnPO$_4$ were observed using a scanning electron microscope (SEM), and SEM images of LiFePO$_4$ and LiMnPO$_4$ are shown in FIGS. 3 and 4.

Referring to FIGS. 3 and 4, it can be observed that nano scale electrode materials 1 and 2 synthesized using a method of synthesizing nano scale electrode materials according to the present disclosure include nanoscale particles, which are uniformly distributed, and most of the particles have pebble shapes. In this case, nano scale electrode materials 1 and 2 had sizes of about 20 nm to about 50 nm.

Experimental Example 3

Figure 5:
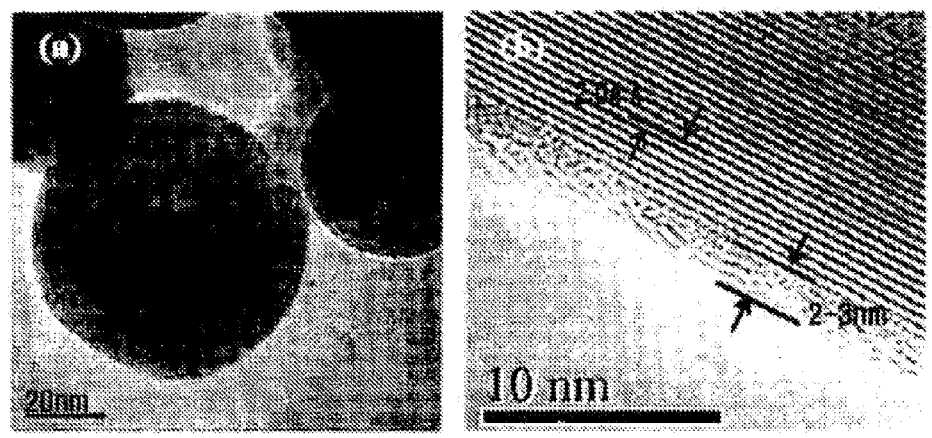
FIG. 5 are a field emission-transmission electron microscope (FE-TEM) image (a) of LiFePO$_4$, which is the nano scale electrode material 1 synthesized using the method of synthesizing the nano scale electrode material according to Example 1 of the present disclosure and an enlarged image (b) of a boundary between particles of LiFePO$_4$ shown in the image (a)

To confirm whether the nano scale electrode material 1 obtained in Example 1 of the present disclosure was coated with a carbon layer, LiFePO$_4$ was obtained using a field emission-transmission electron microscope (FE-TEM), and FE-TEM images of LiFePO$_4$ are shown in FIG. 5.

FIG. 5(a) is an FE-TEM image of the nano scale electrode material 1 synthesized according to Example 1 of the present disclosure, and FIG. 5(b) is an enlarged view of a boundary between particles of the nano scale electrode material 1 shown in FIG. 5(a).

Referring to FIG. 5(b), it can be confirmed that the boundary between the particles was uniformly coated with a 2 to 3-nm noncrystalline layer assumed to be a carbon layer.

Therefore, it can be seen from FIG. 5 that LiFePO$_4$ having olivine structures, which had high crystallinity and were coated with a nanoscale carbon layer, were synthesized using a method of synthesizing nano scale electrode materials according to the present disclosure.

Experimental Example 4

The carbon contents of the nano scale electrode material 1 obtained in Example 1 and the comparative electrode material obtained in Comparative Example 1 were analyzed and are shown in Table 1.

TABLE 1

| Sample | C | H | N |
|---|---|---|---|
| Nano scale electrode material 1 (LiFePO$_4$) | 4.911(%) | 0.448(%) | 0(%) |
| Comparative electrode material (LiFePO$_4$) | 0.855(%) | 0.013(%) | 0(%) |

Referring to Table 1, it can be seen that the carbon content of 4CiFePO4(LiFePO$_4$), which was nano scale electrode material 1 synthesized in Example 1 of the present disclosure, was about five times greater than the carbon content of LiFePO$_4$, which was the comparative electrode material synthesized using a commercially available solid-state reaction method. From this result, it can be indirectly inferred that a noncrystalline layer formed at the boundary shown in (b) of FIG. 5 was a carbon layer.

Example 3

LiFePO$_4$ obtained in Example 1, carbon black, and a polytetrafluoroethylene (PTFE) binder were mixed at a ratio of 1:1:1. Thereafter, the mixture was compressed using a stainless steel mesh and dried in a vacuum state at a temperature of about 180° C. for five hours to manufacture a secondary electrode. The dried mixture was used as a cathode, a lithium metal was used as an anode, and a mixture obtained by mixing ethylene carbonate with dimethyl carbonate (DMC) containing 1M of LiPF$_6$ at a ratio of 1:1 was used as an electrolyte, thereby manufacturing the secondary battery.

Example 4

The same method as in Example 3 was performed except that LiMnPO$_4$ obtained in Example 2 was used, thereby manufacturing a secondary battery.

Experimental Example 5

Figure 6:
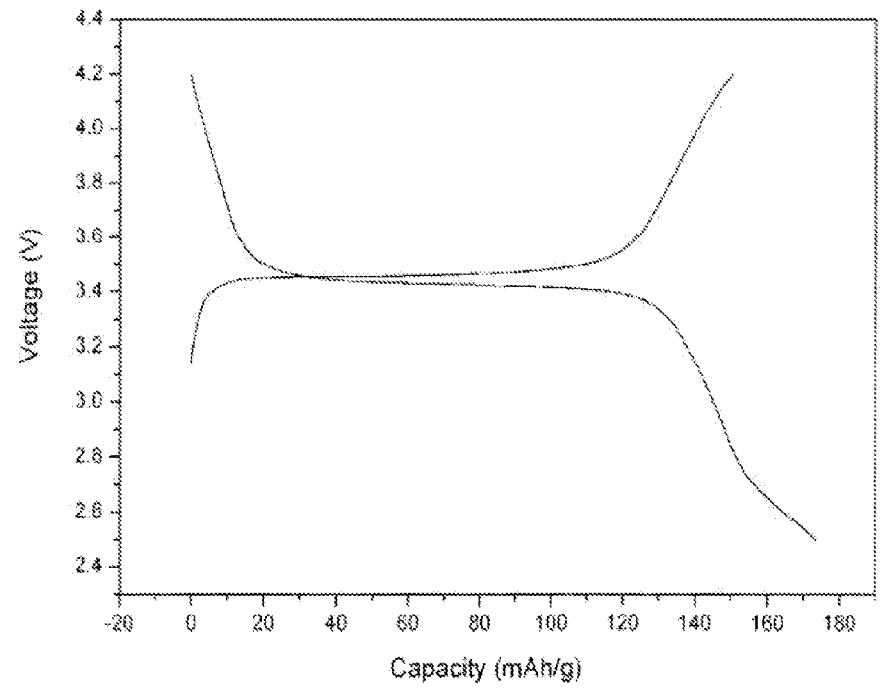
FIG. 6 is a graph showing initial discharge capacity characteristics of a secondary battery manufactured according to Example 3 of the present disclosure.
Figure 7:
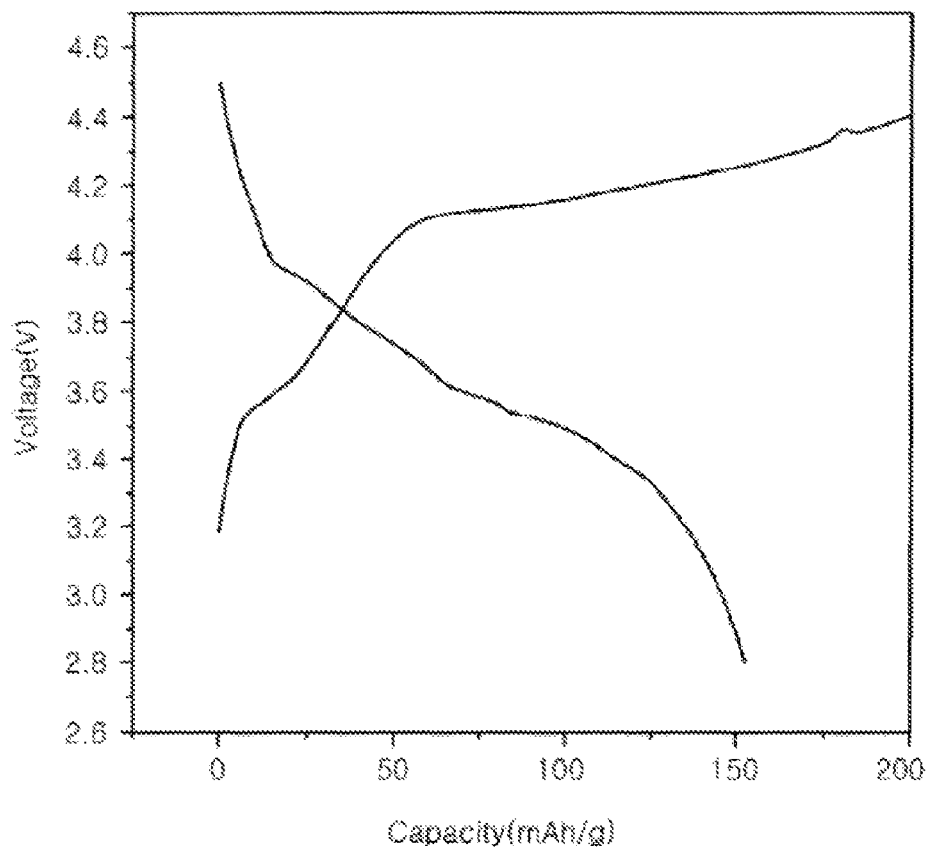
FIG. 7 is a graph showing initial discharge capacity characteristics of a secondary battery manufactured according to Example 4 of the present disclosure.

Initial discharge capacity characteristics of the secondary batteries manufactured in Examples 3 and 4 were measured within a voltage range of about 2.5 V to about 4.2 V for one cycle at a current speed of about 0.1 mA/cm$^2$, and measurement results are respectively shown in curves of FIGS. 6 and 7.

Referring to FIGS. 6 and 7, it can be confirmed that the secondary batteries had a capacity of about 152 mAh/g when charged, and had a capacity of about 170 mAh/g when discharged. That is, it can be seen that the secondary batteries had a discharge capacity approximately equal to a theoretical capacity of about 170 mAh/g. Also, FIG. 6 shows that the secondary battery measured in Example 3 had a very good voltage plateau and an excellent electrochemical characteristic.

Experimental Example 6

Figure 8:
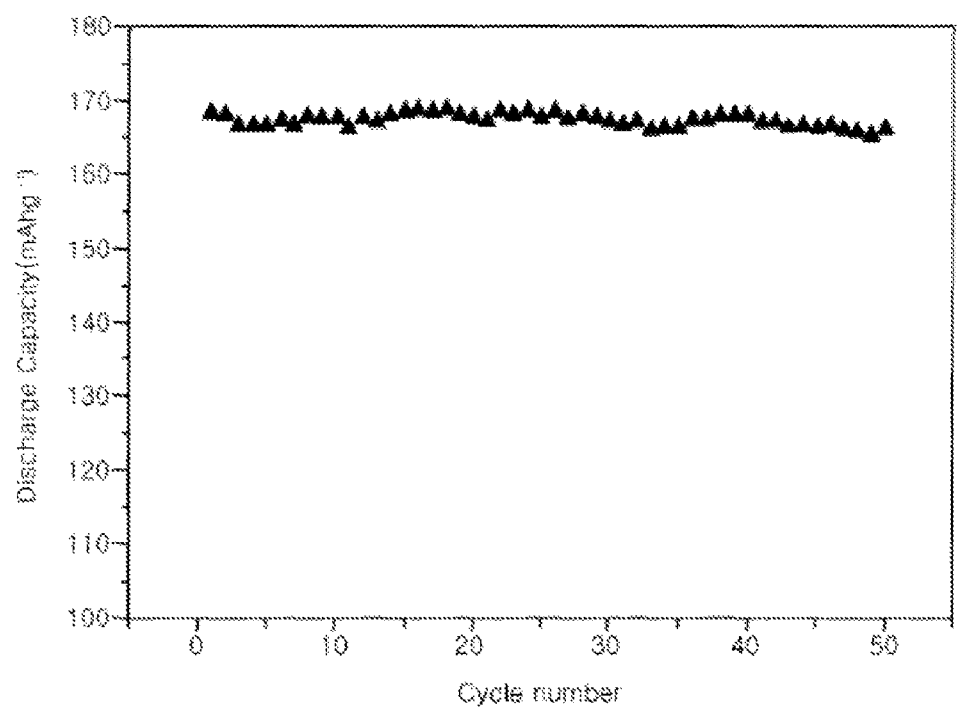
FIG. 8 is a graph showing discharge capacity characteristics per cycle of a secondary battery manufactured according to Example 3 of the present disclosure.

A discharge capacity characteristic of the secondary battery manufactured in Example 3 was measured within a voltage range of about 2.5 V to about 4.2 V at a current speed of about 0.1 mA/cm$^2$ for 50 cycles and analyzed, and measurement results are shown in FIG. 8.

Referring to FIG. 8, it can be seen that the discharge capacity characteristic was not degraded but maintained almost constant while charging and discharging operations were performed over 50 cycles. It can be seen that the secondary battery had a very high average discharge capacity of about 168 mAh/g.

Therefore, it can be concluded that a nano scale electrode material obtained using an ultrafast combustion technique according to a method of synthesizing nano scale electrode materials of the present disclosure has such a high crystallinity as to overcome low electrical conductivity and a low diffusion rate of lithium ions and contains uniformly distributed particles coated with nanoscale carbon.

Although exemplary embodiments have been described it will be readily understood by those skilled in the art that various modifications and changes can be made thereto without departing from the spirit and scope of the present disclosure defined by the appended claims.

What is claimed is:

1. A method of synthesizing nano scale electrode materials, the method comprising:
    forming a reaction solution by mixing a polyol solvent, a transition metal compound, a polyacid anionic compound, a lithium (Li)-based compound, and a combustible liquid;
    burning the reaction solution; and
    obtaining nano scale electrode materials by retrieving particles remaining after the burning of the reaction solution.

2. The method of claim 1, wherein the transition metal compound, the polyacid anionic compound, and the Li-based compound are contained in the reaction solution at a molar ratio of 1:1:1.

3. The method of claim 1, wherein the polyol solvent is at least one selected from the group consisting of ethylene glycol (EG), diethylene glycol (DEG), tetraethylene glycol (TTEG), propylene glycol (PG), and butylene glycol (BG).

4. The method of claim 1, wherein the transition metal compound is at least one selected from the group consisting of an iron (Fe)-based compound, a manganese (Mn)-based compound, a nickel (Ni)-based compound, a cobalt (Co)-based compound, a titanium (Ti)-based compound, and a vanadium (V)-based compound.

5. The method of claim 4, wherein the Fe-based compound is at least one selected from the group consisting of Fe(CH$_3$COO)$_2$, Fe(NO$_3$)$_2$, FeC$_2$O$_2$, FeSO$_4$, FeCl$_2$, FeI$_2$, and FeF$_2$.

6. The method of claim 4, wherein the Mn-based compound is at least one selected from the group consisting of Mn(CH$_3$COO)$_2$, Mn(NO$_3$)$_2$, MnSO$_4$, MnC$_2$O$_2$, MnCl$_2$, MnI$_2$, and MnF$_2$.

7. The method of claim 4, wherein the Ni-based compound is at least one selected from the group consisting of Ni(CH$_3$COO)$_2$, Ni(NO$_3$)$_2$, NiSO$_4$, NiC$_2$O$_2$, NiCl$_2$, NiI$_2$, and NiF$_2$.

8. The method of claim 4, wherein the Co-based compound is at least one selected from the group consisting of Co(CH$_3$COO)$_2$, Co(NO$_3$)$_2$, CoSO$_4$, CoC$_2$O$_2$, CoCl$_2$, CoI$_2$, and CoF$_2$.

9. The method of claim 4, wherein the Ti-based compound is at least one selected from the group consisting of TiH$_2$ and titanium isopropoxide (TTIP).

10. The method of claim 4, wherein the V-based compound is at least one selected from the group consisting of V(CH$_3$COO)$_2$, V(NO$_3$)$_2$, VSO$_4$, VC$_2$O$_2$, VCl$_2$, VI$_2$, and VF$_2$.

11. The method of claim 1, wherein the polyacid anionic compound is a phosphoric acid ionic compound or a sulfuric acid ionic compound.

12. The method of claim 11, wherein the phosphoric acid ionic compound is at least one selected from the group consisting of NH$_4$H$_2$PO$_4$, H$_3$PO$_4$, (NH$_4$)$_2$HPO$_4$, and (NH$_4$)$_3$PO$_4$.

13. The method of claim 11, wherein the sulfuric acid ionic compound is at least one selected from the group consisting of H$_2$SO$_4$, (NH$_4$)$_2$SO$_4$, FeSO$_4$, MnSO$_4$, NiSO$_4$, CoSO$_4$, VSO$_4$, and TiSO$_4$.

14. The method of claim 1, wherein the Li-based compound is at least one selected from the group consisting of $CH_3COOLi$, $LiOH$, $LiNO_3$, $LiCO_3$, $Li_3PO_4$, and $LiF$.

15. The method of claim 1, wherein the combustible liquid is at least one selected from the group consisting of ethanol, methanol, acetone, painting oil, acetaldehyde, kerosene, and gasoline.

* * * * *